United States Patent [19]

Chambers et al.

[11] 4,264,708
[45] Apr. 28, 1981

[54] RADIATION SENSITIVE ELEMENT HAVING A THIN PHOTOPOLYMERIZABLE LAYER

[75] Inventors: William J. Chambers; Christina N. Lazaridis, both of Wilmington, Del.

[73] Assignee: E. I. Du Pont de Nemours and Company, Wilmington, Del.

[21] Appl. No.: 134,229

[22] Filed: Mar. 26, 1980

Related U.S. Application Data

[63] Continuation of Ser. No. 892,295, Mar. 31, 1978, abandoned, which is a continuation-in-part of Ser. No. 814,434, Jul. 11, 1977, abandoned.

[51] Int. Cl.³ .............................................. G03C 1/68
[52] U.S. Cl. .................................... 430/278; 430/288; 430/905; 430/910; 430/919; 204/159.18; 204/159.23
[58] Field of Search ............... 430/278, 288, 919, 905, 430/910; 204/159.18, 159.23

[56] References Cited

U.S. PATENT DOCUMENTS

| 3,549,369 | 12/1970 | Chang et al. | 430/919 |
| 3,661,576 | 5/1972 | Crary | 430/285 |
| 3,984,244 | 10/1976 | Collier et al. | 427/369 |

FOREIGN PATENT DOCUMENTS

| 1042520 | 9/1966 | United Kingdom . |
| 1312492 | 4/1973 | United Kingdom . |

*Primary Examiner*—Jack P. Brammer

[57] ABSTRACT

A photopolymerizable element, preferably a lithographic plate, is provided. This element comprises a substrate bearing a photopolymerizable layer having a weight of about 1 to about 90 mg/dm², said layer comprising:

(1) at least one ethylenically unsaturated diester polyhydroxy polyether of the formula

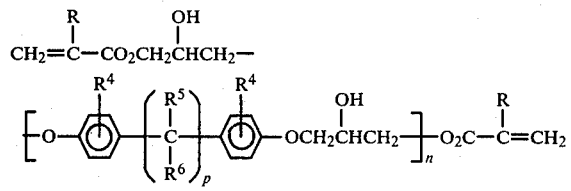

wherein R is H or CH₃; R⁴ is H or an alkyl of 1–4 carbon atoms; n is 1–15; p is 0 or 1; and, when p is 1, R⁵ is H or CH₃, and R⁶ is H, CH₃ or C₂H₅;

(2) an organic, radiation-sensitive, free-radical generating system comprising 2,4,5-triarylimidazolyl dimer and p-aminophenyl ketone; and (3) a macromolecular, organic, polymeric binder.

A polymeric image is formed by imagewise exposing the layer to actinic radiation and then developing the resulting image such as by removing unexposed portions of the layer with a solvent.

15 Claims, No Drawings

RADIATION SENSITIVE ELEMENT HAVING A THIN PHOTOPOLYMERIZABLE LAYER

CROSS-REFERENCE TO RELATED APPLICATIONS

This is a continuation of copending application Ser. No. 892,295, filed Mar. 31, 1978 now abandoned which in turn is a continuation-in-part of application Ser. No. 814,434, filed July 11, 1977 now abandoned.

BACKGROUND OF THE INVENTION

1. Field of the Invention

This invention relates to photopolymerizable elements and methods of photoimaging and more particularly to such elements and methods useful in preparing lithographic plates.

2. Relation to the Prior Art

Photopolymerizable compositions and elements useful to form images are well known in the art. Many references in the literature and patent art have described photopolymerizable elements and the initiator systems, monomers, the photopolymerization reactions, the role of oxygen and other variables and components that make up such elements. The elements have many described uses with a particularly preferred use being in lithographic printing.

While photopolymerizable lithographic plates are available commercially, these plates usually require cover sheets or topcoats to prevent oxygen inhibition. Also, it is always desirable to improve image fidelity as indicated by halftone dot quality and to improve photospeed, especially in air.

British Pat. No. 1,006,587 describes ethylenically unsaturated polyhydroxy polyethers as compositions, and the U.S. equivalent (U.S. Pat. No. 3,373,075) claims a fibrous impregnating composition comprising a solution of the ethylenically unsaturated compound and a thermal, addition-polymerization initiator.

Photopolymerizable compositions which contain ethylenically unsaturated diester polyhydroxy polyethers are known. Crary (U.S. Pat. No. 3,661,576) describes such compositions and photoresist articles which use an addition polymerization initiator. German Pat. No. 2,541,133 describes such compositions which also contain an N-nitrosodiarylamine to minimize thermal polymerization. Japanese published Patent Application Ser. No. 77,007,362, published Mar. 2, 1977, also describes such compositions useful for printing plates which also contain alkali soluble copolymer resin capable of being addition polymerized with the diester through a photochemical reaction.

Collier et al., (U.S. Pat. No. 3,984,244) describes a channeled photosensitive element, useful as a solder mask for printed circuit boards. Among the suitable monomers described is polyoxyethyl-2,2-di(p-hydroxyphenyl)propane dimethacrylate. Among the suitable addition polymerization initiators disclosed is 2,4,5-triarylimidazolyl dimers with hydrogen donors.

Assignee's copending application (Gervay et al., U.S. Ser. No. 735,979, filed Oct. 27, 1976) discloses a halogen-containing photopolymerizable composition which comprises an ethylenically unsaturated monomer including ethylenically unsaturated diester polyhydroxy polyether, an initiator system including 2,4,5-triaryliminidazolyl dimer plus hydrogen donor polymerization initiator, and a selected binder which contains polyacrylonitrile. The compositions are useful in solder mask and other photoresist applications.

Chang et al. (U.S. Pat. No. 3,549,367) describe an addition-polymerization photoinitiating system based on a mixture of 2,4,5-triarylimidazolyl dimer and a p-aminophenyl ketone.

None of the art discloses a photopolymerizable element, useful in lithographic printing, comprising a substrate bearing a photopolymerizable layer containing an ethylenically unsaturated diester polyhydroxy polyether and an addition-polymerization photoinitiator system based on a mixture of 2,4,5-triarylimidazolyl dimer and a p-aminophenylketone.

SUMMARY OF THE INVENTION

According to the present there is provided a photopolymerizable element comprising: a substrate bearing a photopolymerizable layer having a dry weight of about 1 to about 90 mg/dm$^2$, said layer comprising:

(1) at least one ethylenically unsaturated diester polyhydroxy polyether of the formula

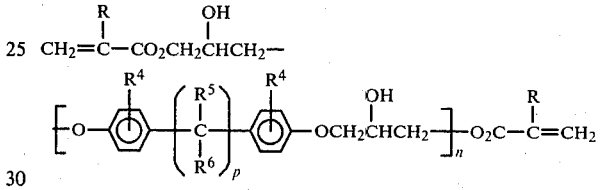

wherein R is H or CH$_3$, R$^4$ is H or an alkyl of 1–4 carbon atoms; n is 1–15; p is 0 or 1; and, when p is 1, R$^5$ is H or CH$_3$, and R$^6$ is H, CH$_3$ or C$_2$H$_5$;

(2) about 1 to about 10 percent by weight, based on the total photopolymerizable layer, of an organic, radiation-sensitive, free-radical generating system comprising at least one 2,4,5-triarylimidazolyl dimer and at least one p-aminophenyl ketone; and (3) about 1 to about 90 percent by weight, based on the total photopolymerizable layer, of a macromolecular, organic, polymeric binder.

There is also provided a method of producing a polymeric image comprising imagewise exposing a portion of the photopolymerizable layer of the aforesaid element to actinic radiation whereby the unsaturated diester compound is polymerized in the radiation-struck areas, and developing the resulting image.

DETAILED DESCRIPTION OF THE INVENTION

The present invention is directed to a photopolymerizable element having as the photopolymerizable layer an ethylenically unsaturated diester polyhydroxy polyether, a free-radical generating addition polymerization initiator comprising a combination of a 2,4,5-triarylimidazolyl dimer and a p-aminophenyl ketone, and a macromolecular organic polymeric binder. Such elements are of particular utility as components of a lithographic printing plate.

Use of the specified ethylenically unsaturated diesters gives compositions which are relatively insensitive to oxygen, and polymerization can be carried out without the need for a topcoat or a cover sheet, as is usually required. Combination of the specified ethylenically unsaturated diesters and 2,4,5-triarylimidazolyl dimer/p-aminophenyl ketone polymerization initiators gives elements which show extremely high photospeeds compared with elements using benzophenone/p-aminophenyl ketone initiated systems. Extremely and unexpectedly good reproduction of both highlight and shadow half-tone dots is obtained, as shown in Example 7, compared with a conventional lithographic plate.

The ethylenically unsaturated diester polyhydroxy polyethers used in the invention have the structure

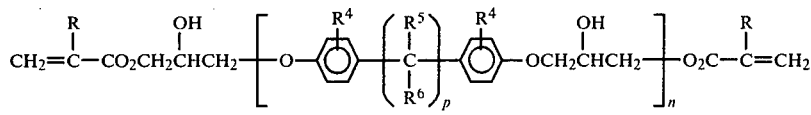

wherein R, $R^4$, $R^5$, $R^6$, n and p are as specified above. Preferably $R^4$ is H, $R^5$ and $R^6$ are $CH_3$, n is 1–4 and p is 1. Diesters of the preferred compositions are commercially available, and bis-epoxide precursors of the longer chain diesters are commercially available from various sources as epoxy resins. The ethylenically unsaturated diesters are described in U.S. Pat. Nos. 3,661,576, 3,373,075 and 3,637,618, and they may be prepared by reaction of two moles of acrylic or methacrylic acid with one mole of a suitable diepoxy compound in the presence of a tertiary amine catalyst and a vinyl polymerization inhibitor.

The amount of ethylenically unsaturated diester may vary over wide limits, for example, about 1 to about 98 pecent by weight based on the total photopolymerizable layer. Preferably the photopolymerizable layer contains about 10 to about 79 percent by weight of ethylenically unsaturated diester, more preferably about 15 to about 75 percent, and most preferably about 45 to about 75 percent by weight.

The outstanding properties of the elements of the invention are also realized when a minor proportion, i.e., up to about 25 percent by weight, of the ethylenically unsaturated diester polyhydroxy polyether is replaced with at least one conventional ethylenically unsaturated compound. If greater than about 25 percent of a conventional ethylenically unsaturated compound is employed, the resulting photopolymerizable layer is undesirably soft.

The conventional ethylenically unsaturated compound preferably has a boiling point above about 90° C. at normal atmospheric pressure and contains at least one terminal ethylenic group, but may contain a plurality, such as 2–5 terminal ethylenic groups. Especially useful as conventional ethylenically unsaturated compounds are unsaturated esters of α-methylene carboxylic acids and substituted α-methylene carboxylic acids with alkylene polyols and polyalkylene polyols. Particularly preferred are alkylene polyol di-, tri-, and tetraacrylates and methacrylates; and polyalkylene polyol di-, tri-, and tetraacrylates and methacrylates prepared from alkylene polyols of 2–5 carbon atoms or polyalkylene ether polyols or glycols which contain 1–10 ether linkages.

The following specific compounds are further illustrative of conventional ethylenically unsaturated compounds: ethylene glycol diacrylate, diethylene glycol dimethacrylate, glycerol diacrylate, glycerol triacrylate, trimethylolpropane triacrylate, ethylene glycol dimethacrylate, 1,3-butanediol dimethacrylate, 1,2,4-butanetriol trimethacrylate, 1,4-cyclohexanediol diacrylate, 1,4-benzenediol dimethacrylate, 1,2-benzenedimethanol diacrylate, pentaerythritol triacrylate, pentaerytritol tetraacrylate, pentaerythritol tetramethacrylate, 1,3-propanediol diacrylate, 1,3-pentanediol dimethacrylate, p-α,α-dimethylbenzylphenyl acrylate, t-butyl acrylate, N,N-diethylaminoethyl acrylate, diethylaminoethyl methacrylate, 1,4-butanediol diacrylate, hexamethylene glycol diacrylate, decamethylene glycol diacrylate, 2,2-dimethylolpropane diacrylate, tripropylene glycol diacrylate, 2,2-di(p-hydroxyphenyl)propane diacrylate, 2,2-di(p-hydroxyphenyl)propane dimethacrylate, polyoxyethyl-2,2-di(p-hydroxyphenyl)propane dimethacrylate, polyoxypropyltrimethylolpropane triacrylate (molecular weight of 462), 1,4-butanediol dimethacrylate, hexamethylene glycol dimethacrylate, 2,2,4-trimethyl-1,3-pentanediol dimethacrylate, 1-phenylethylene glycol dimethacrylate, trimethylolpropane trimethacrylate, triethylene glycol dimethacrylate, ethylene glycol acrylate phthalate, polyoxyethyltrimethylolpropane triacrylate, the bisacrylates and methacrylates of polyethylene glycols of molecular weight 200–500, and the like, tetraethylene glycol dimethacrylate and tetraethylene glycol diacrylate.

The photopolymerizable layer also contains an organic, radiation-sensitive, free-radical generating system which initiates polymerization of the unsaturated component, and does not subsequently terminate the polymerization. The word "organic" is used here and in the claims to designate compounds which contain carbon, and one or more oxygen, hydrogen, nitrogen, sulfur and halogen, but no metal. The free-radical generating system comprises at least one 2,4,5-triarylimidazolyl dimer and at least one p-aminophenyl ketone. Such triarylimidazolyl dimer/p-aminophenyl ketone photoinitiating systems are described in U.S. Pat. No. 3,549,367. The 2,4,5-triarylimidazolyl dimers are also described in U.S. Pat. Nos. 3,479,185 and 3,784,557. Suitable triarylimidazolyl dimers include 2-(o-chlorophenyl)-4,5-diphenylimidazolyl dimer, 2-(o-chlorophenyl)-4,5-di(m-methoxyphenyl)imidazolyl dimer, 2-(o-fluorophenyl)-4,5-diphenylimidazolyl dimer, 2-(o-methoxyphenyl)-4,5-diphenylimidazolyl dimer, 2-(p-methoxyphenyl)-4,5-diphenylimidazolyl dimer 2,4-di(p-methoxyphenyl)-5-phenylimidazolyl dimer, 2-(2,4-dimethoxyphenyl)-4,5-diphenylimidazolyl dimer, 2-(p-methylmercaptophenyl)-4,5-diphenylimidazolyl dimer, and the like.

The p-aminophenyl ketone can be represented by the formula

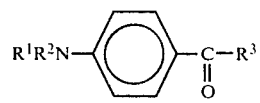

where $R^1$ and $R^2$ are each hydrogen, a lower alkyl group of 1–4 carbon atoms, or, together with the shown nitrogen, form a morpholino ring, and $R^3$ is alkyl of 1–4 carbon atoms, monocarbocyclic aryl, preferably phenyl or substituted phenyl, and preferably a

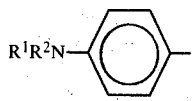

group. Particularly preferred is Michler's ketone.

Suitable p-aminophenylketones which may be employed are described in U.S. Pat. No. 3,552,973.

The useful ratios of dimers and ketones employed may vary greatly depending upon the particular components of the photopolymerizable layer which are present. For most purposes, a molar ratio of 2,4,5-triarylimidazolyl dimers to p-aminophenylketones of about 0.3:1 to 1.5:1 is suitable. A preferred molar ratio is about 0.5:1 to about 1:1. For best results a molar ratio of about 0.5:1 should be employed. The concentration of the free-radical generating system employed should be about 1–10% by weight, based on the total photopolymerizable layer.

In addition, the free-radical generating system may be used with free-radical producing electron or hydrogen donors such as 2-mercaptobenzoxazole, 2-mercaptobenzthiazole, Leuco Crystal Violet or tris(4-diethylamino-2-methylphenyl)methane. Such donors are also described in U.S. Pat. No. 3,479,185.

In addition, the photopolymerizable layers, especially when used in the preparation of lithographic printing plates, may and preferably do contain a colorant and/or a color producing agent, e.g., a leuco dye. The amine-substituted leuco dyes can function both in the role of a color-forming agent and a free-radical producing agent. Especially useful leuco dyes are those having at least one dialkylamino group. Also, any amine-substituted leuco triphenylmethane dye or various salts of the dye, e.g., the hydrochloride salt of the leuco dye can be used. Examples of suitable dyes which can be used are listed in U.S. Pat. No. 3,549,367.

Macromolecular organic polymers useful as the binder typically have number average molecular weights of at least about 1500, preferably at least about 4,000. Preferred macromolecular organic polymeric binders are those polymers which are radiation-transparent and film-forming. Examples of suitable binders include such polymer types as (a) copolyesters based on terephthalic, isophthalic, sebacic, adipic and hexahydroterephthalic acids; (b) nylons or polyamides; (c) vinylidene chloride copolymers; (d) ethylene/vinyl acetate copolymers; (e) cellulosic ethers; (f) synthetic rubbers; (g) cellulose esters; (h) polyvinyl esters including polyvinyl acetate/acrylate and polyvinyl acetate/methacrylate copolymers; (i) polyacrylate and α-alkyl-polyacrylate esters, e.g., polymethyl methacrylate, polyethyl methacrylate, and methyl methacrylate/ethyl acrylate copolymers; (j) high molecular weight polyethylene oxides or polyglycols having average molecular weights of about 4000–1,000,000; (k) polyvinyl chloride and copolymers; (l) polyvinyl acetal; (m) polyurethanes; (n) polycarbonates; (o) polystyrenes.

Particularly preferred organic polymer binders contain acid or water-soluble salt groups, e.g., carboxyl and sulfonic groups. There can be insufficient acid groups to make the polymer soluble in dilute sodium hydroxide or sodium carbonate alone, but preferably it should be soluble in a mixture of an organic solvent, water, and sufficient base to convert the majority of the acid groups to salt groups. Examples of such preferred binders are methyl methacrylate/methacrylic acid and partially esterified styrene/maleic anhydride copolymers.

Although thermoplastic binders are normally employed, there can be added in addition to or instead of said binders nonthermoplastic polymeric compounds to improve certain desirable characteristics, e.g., adhesion to the base support, adhesion to the image-receptive support on transfer, wear properties, chemical inertness, etc. Suitable nonthermoplastic polymeric compounds include polyvinyl alcohol, cellulose, anhydrous gelatin, phenolic resins and melamine-formaldehyde resins, etc. Binders are usually employed in amounts between about 1 and about 90 percent, preferably about 15 to about 80 percent, more preferably about 20 to about 80 percent, and most preferably about 20 to about 50 percent by weight of the total photopolymerizable layer.

If desired, the photopolymerizable layer can also contain immiscible polymeric or nonpolymeric organic fillers or reinforcing agents which are essentially transparent at the wavelengths used for the exposure, e.g., the organophilic silicas, bentonites, silica, powdered glass, colloidal carbon, as well as various types of pigments. Such materials are used in amounts varying with the desired properties of the photopolymerizable layer. The fillers are useful in improving the strength of the compositions, reducing tack and in addition, as coloring agents. Other soluble additives which may also be employed include dyes and dispersing agents. A number of such ingredients are listed in U.S. Pat. Nos. 2,760,863, 3,060,026, and 3,203,805.

When the binder polymer is a hard, high-melting compound, a plasticizer may be used to lower the glass transition temperature and facilitate selective development. The plasticizer may be any of the common plasticizers compatible with the polymeric binder. Suitable plasticizers include the polyethylene glycols such as the commercially available carbowaxes, and related materials such as substituted phenol/ethylene oxide adducts, e.g., the polyethers obtained from o-, m-, and p-cresol, o-, m-, and p-phenylphenol and p-nonylphenol, including commercially available materials such as the alkyl phenoxypolyoxyethylene ethanols. Other plasticizers include the acetates, propionates, butyrates and other carboxylate esters of ethylene glycol, diethylene glycol, glycerol, pentaerythritol, and other polyhydric alcohols, and alkyl and aryl phosphates such as tributyl phosphate, trihexyl phosphate, trioctyl phosphate, triphenyl phosphate, tricresyl phosphate and cresyl diphenyl phosphate.

In order to prevent addition polymerization prior to use, there may be incorporated in the compositions a minor amount, for example, 1 to 5000 parts per million of the whole photopolymerizable layer, of a stabilizer which prevents addition polymerization, e.g., hydroquinone, tertiary-butyl catechol, butylated hydroxytoluene, and the nitroso dimer inhibitor system described in British Pat. No. 1,453,681. Such polymerization inhibitors improve the storage stability of the photopolymerizable elements by preventing premature thermal polymerization or that induced by accidental exposure to adventitious radiation.

The photopolymerizable elements may have antihalation material beneath the photopolymerizable layer. For instance, the substrate may contain an antihalation material or have a layer or stratum of such material on its surface. The antihalation layer intermediate between the photopolymerizable layer and the substrate when used must have adequate adhesion to the substrate and the photo-polymerizable layer and not react with the radiation-adsorptive material. Antihalation pigments and resin carriers are described in British Pat. No. 1,366,769.

The photopolymerizable layers described herein may be applied to a wide variety of substrates. By "substrate" is meant any natural or synthetic support, preferably one which is capable of existing in a flexible or rigid film or sheet form. For example, the substrate can be a metal sheet or foil, a sheet or film of synthetic organic resin, cellulose paper, fiberboard, and the like, or a composite of two or more of these materials. Suitable substrates include those described in U.S. Pat. Nos. 2,760,863, 3,060,026 and 3,458,311, including substrates bearing the various antihalation layers and adherent sublayers described therein. Preferred substrates are thin, flexible, and have a hydrophilic surface, e.g., grained aluminum sheets, steel sheets, and polyvinylidene chloride copolymer-coated oriented polyester film.

The particular substrate will generally be determined by the use application involved. For example, the photo-polymerizable elements of this invention are particularly useful for the preparation of lithographic plates when an aluminum substrate is used. Aluminum substrates are available commercially in a wide variety of thicknesses. The aluminum may be untreated (except for the thin layer of oxide which forms immediately at its surface when exposed to air) or it may have been provided with surface treatments or coatings to leave a hydrophilic surface. The surface can be roughened (mechanically, chemically, or electrochemically) to improve retention of aqueous liquids and to improve adhesion to strata to be applied thereon.

The photopolymerizable elements of this invention are unusually low in sensitivity to inhibition of polymerization by oxygen, and satisfactory images can often be obtained by exposure of the element to radiation in the presence of air. Nevertheless, it is sometimes desirable to increase imaging speeds even higher, and imaging in vacuum or the use of a top-coat or protective stratum for the element may be employed. Such top-coats should be transparent to actinic radiation, substantially impermeable to oxygen and preferably permeable to water. Suitable coatings have been previously described, e.g., in U.S. Pat. No. 3,458,311, and in British Pat. Nos. 1,148,362, and 1,303,578.

A photopolymerizable composition to form the layer of the photopolymerizable element is usually applied as a solution in a carrier solvent. The solution may be sprayed, brushed, applied by a roller or an immersion coater, flowed over the surface, picked up by immersion or applied to the substrate by other suitable means. The solvent is then allowed to evaporate. In general, solvents are employed which are volatile at ordinary pressures. Examples of suitable solvents include amides such as N,N-dimethylformamide and N,N-dimethylacetamide; alcohols and ether alcohols such as methanol, ethanol, 1-propanol, 2-propanol, butanol, ethylene glycol, 2-butoxyethanol, and 2-ethoxyethanol; esters such as methyl acetate and ethyl acetate; aromatic hydrocarbons and aromatic halocarbons such as benzene, o-dichlorobenzene and toluene; ketones such as acetone, 2-butanone, and 3-pentanone; aliphatic halocarbons such as methyl chloroform, methylene chloride, chloroform, 1,1,2-trichloroethane, 1,1,2,2-tetrachloroethane, 1,1,2-trichloroethylene; miscellaneous solvents such as dimethyl sulfoxide, pyridine, tetrahydrofuran, 1,2-dimethoxyethane, dioxane, dicyanocyclobutane, N-methylpyrrolidone; and mixtures of these solvents in various proportions as may be required to attain solutions. After drying, the photopolymerizable layer of the elements of the invention has a coating weight in the range of about 1–90 mg/dm$^2$, preferably about 10–70 mg/dm$^2$.

The photopolymerizable elements of this invention are exposed imagewise to actinic radiation, a portion of which contains wavelengths between about 2000–8000 Å, preferably between about 2500–5000 Å. Imagewise exposure is preferably through an image-bearing transparency. Suitable sources of such radiation include ordinary sunlight and artificial sources such as sunlamps, pulsed and continuous xenon flash lamps, tungsten-halogen lamps, germicidal lamps, ultraviolet lamps providing specifically radiation of short wavelength (2537 Å), and lamps providing radiation of longer wavelengths, narrow or broad band, centered near 3600 Å, 4200 Å, 4500 Å, or 5000 Å, such as fluorescent lamps, mercury, metal additive, and arc lamps. Argon glow lamps, photographic flood lamps, and other fluorescent radiation sources such as the tracings on the face of a cathode ray tube may also be used. Electron accelerators and electron beam sources through an appropriate mask are also suitable. Of these, the mercury-vapor lamps, particularly the sun lamp or "black light" type, the fluorescent sun lamps, the xenon flash lamps, and the tungsten-halogen lamps are the most preferred.

The radiation exposure times may vary from fractions of a second to minutes, depending upon the intensity and spectral energy distribution of the radiation used, its distance from the photopolymerizable layer, and the amount of the ethylenically unsaturated component. Customarily, a distance of about 1.5 to 60 inches (3.8–153 cm) from the photopolymerizable layer is used. Exposure temperatures are not particularly critical, but it is preferred to operate at about ambient temperatures or slightly higher, i.e., about 20 to about 50° C.

Imagewise exposure is conveniently carried out by exposing the photopolymerizable element to actinic radiation through a process transparency. The process transparency may be an image-bearing transparency consisting solely of areas substantially opaque and substantially transparent to the radiation being used, where the opaque areas are substantially of the same optical density, for example, a so-called line or halftone negative or positive, or it may have a graded range of opaque areas, for example, a continuous tone negative. Process transparencies may be constructed of any suitable materials including cellulose acetate film and polyester film.

After exposure, the image is developed. Development may be by toning, i.e., dusting with a fine pigment which selectively adheres to the tacky unhardened areas or by dye absorption imaging. Generally, however, the portions of the layer corresponding to the unexposed portions are removed, e.g., in lithographic applications. This method of development may be achieved by pressure transfer, differential adhesion of the exposed versus unexposed areas and, preferably, by solvent washout. The solvent liquid used for development should have good solvent action on the non-polymerized portions of the layer and little action on the insolubilized image in the time required to remove the soluble portions.

When an organic polymer binder which contains acid or water-soluble salt groups is employed, an aqueous basic solvent is preferably used for development. Preferred solvents include aqueous base to which is added a water-soluble organic solvent, e.g., isopropyl alcohol, 2-butoxyethanol, 2-(2-butoxyethoxy)ethanol, and glycerol. The particular solvent combination chosen will depend upon the acid content of the binder and the amount of binder employed. Suitable aqueous solvent combinations are described in U.S. Pat. No. 3,796,602.

In addition to their use in lithographic printing, the photopolymerizable elements of this invention are useful for various pattern or image yielding purposes. They are especially useful in making printing reliefs by the general procedures described in U.S. Pat. Nos. 2,760,863 and 3,060,026. An advantage of the elements is that they have enhanced speed and they are relatively insensitive to oxygen. If desired, they may be used without the usual cover sheet. Other specific uses are described in the above cited patents and in U.S. Pat. No. 3,060,023.

EMBODIMENTS OF THE INVENTION

The following are illustrative examples of the invention in which all parts and percentages are by weight and all degrees are Celsius unless otherwise stated.

The ethylenically unsaturated diester polyhydroxy polyethers employed in the Examples are commercially available under the name Epocryl ® Resins. They have a value of n of about 1.1; Epocryl ® 12 is a dimethacrylate ester (R=CH$_3$), and Epocryl ® 303.1 and DRH 303 are diacrylate esters (R=H).

The aluminum substrates employed for spin-coating at 1000 and 2000 rpm were 3×3 inch (7.6×7.6 cm) plates. In the case of doctor knife coatings, the dry coating thickness can be calculated from the doctor knife setting and the solids content of the coating solution. The coating weight can be approximated using an average polymer density of 1.18 g/cm$^3$.

EXAMPLE 1

A mixture of 5 g of a 9:1 copolymer of methyl methacrylate and methacrylic acid, 5 g of Epocryl ® 12, 0.4 g of 2-o-chlorophenyl-4,5-diphenylimidazolyl dimer, 0.3 g of Michler's ketone, 0.02 g of Leuco Crystal Violet and 0.10 g of C. I. Solvent Red Dye #109 was dissolved in a 1:1 solvent mixture of 2-butoxyethanol:trichloroethylene to give a total of 50 g of solution. The solution was spin-coated onto an anodized aluminum substrate (2000 rpm for 0.75 minute) to give a coating weight of about 20 mg/dm$^2$. The coating was exposed in air to a 275 watt sunlamp held 7.5 inches (19.1 cm) away from the sample for 0.5 minute through a 21-step $\sqrt{2}$ step-wedge process transparency, in which the transmittance of radiation between steps differs by a fraction of $\sqrt{2}$. The exposed film was developed for 5 seconds in a solution prepared from 0.8 g of sodium carbonate, 90 ml of distilled water, and 10 ml of 2-(2-butoxyethoxy)ethanol, to leave an excellent photopolymerized image which showed five steps of polymer.

The developed plate was treated with AGE (Pitman Company), and it was inked with a standard black lithographic printing ink to give an excellent print after pressing on paper.

CONTROL EXPERIMENT

In a control experiment, the formulation of Example 1 was used except that the Epocryl ® 12 was replaced with 5 g of trimethylolpropane triacrylate. Aluminum plates were coated, exposed, and developed as in Example 1. A very faint photopolymer image was obtained in which one step of polymer could barely be detected.

Hence, replacement of Epocryl ® 12 with trimethylolpropane triacrylate gave only a barely discernible image in air.

EXAMPLE 2

Example 1 was repeated except that the 2-butoxyethanol/trichloroethylene coating solvent was replaced with a solvent composed of 30 parts of 2-ethoxyethanol and 10 parts of 2-butanone. The solution was spin-coated (1000 rpm for 0.75 minute) onto an anodized aluminum substrate to give a coating weight of 33.5 mg/dm$^2$ (Plate A). A similar plate, prepared by spin-coating at 2000 rpm, had a coating weight of 19 mg/dm$^2$ (Plate B). Plate B was exposed and developed as described in Example 1, and the plate was finally rinsed with water. A photopolymerized image was obtained which showed five steps of polymer. Good contact and offset hand prints were obtained from this plate.

EXAMPLE 3

A solution of 15 g of a 9:1 copolymer of methyl methacrylate and methacrylic acid in 30 g of 2-butanone was prepared by warming at 45° for 0.5 hr. To this solution was added 90 g of 2-ethoxyethanol, 15 g of Epocryl ® 12, 1.2 g of 2-o-chlorophenyl-4,5-diphenylimidazolyl dimer, 0.9 g of Michler's ketone, 0.06 g of Leuco Crystal Violet, 0.30 g of C.I. Solvent Red Dye #109 and 10 g of methyl chloroform, and the mixture was dissolved by rolling for 1 hour. After standing overnight the solution was filtered, and it was spin-coated onto a 15×20 inch (38.1×50.8 cm) anodized aluminum substrate (275 rpm for 2.0 minutes). The coated plate was air-dried at 100° for 5 minutes to give a coating weight of 68.6 mg/dm$^2$. The plate was exposed through a process transparency for 1.0 minute to a Xenon flash lamp under vacuum to give good contact with the process transparency. (A Xenon flash Nu Arc plate maker was employed at 1 mm pressure; GEPXA Xenon bulb with 2500 watt input at a distance of 16.5 inches (42 cm) from the photopolymerizable layer was used.) The exposed plate was developed for 15 seconds with the development solution of Example 1, and a printing press was used to print 5000 copies from this lithographic plate. Excellent prints were obtained with no evidence of plate wear, and excellent dot size reproduction was also obtained.

EXAMPLE 4

A solution of 5.0 g of a 9:1 copolymer of methyl methacrylate and methacrylic acid in 10 g of 2-butanone was prepared by warming at 40°, and to this solution was added 5.0 g of Epocryl ® 303.1, 0.4 g of 2-o-chlorophenyl-4,5-diphenylimidazolyl dimer, 0.3 g of Michler's ketone, 0.02 g of Leuco Crystal Violet, 0.10 g of C.I. Solvent Red Dye #109, and enough 2-ethoxyethanol to give a total of 50 g of solution. The solution was spin-coated onto an anodized aluminum substrate (2000 rpm for 0.75 min.) to give a coating weight of 33.3 mg/dm$^2$. The plate was exposed (0.5 min.) and developed (development time of 30 seconds) as described in Example 1, and the plate was finally rinsed with water. An excellent image was obtained which showed four steps of polymer, and excellent direct prints were obtained from this plate. Exposure of a similar plate for 1.0 minute gave an image which showed five steps of polymer.

EXAMPLE 5

This example compares the photospeed of compositions prepared using two different Epocryl ® ethylenically unsaturated diesters. The composition of Example 4 was prepared to which was added 0.2 g of benzophenone. The solution (A) was spin-coated onto anodized aluminum supports at 1000 and 2000 rpm (0.75 min.) to give plates with coating weights of 74.0 (Plate A1) and 43.2 mg/dm$^2$ (Plate A2) respectively. Similar plates were prepared from a solution (B) in which the Epocryl ® 303.1 of solution A was replaced with Epocryl ® 12. The plates, prepared by spin-coating solution B onto anodized aluminum substrates at 1000 and 2000 rpm (0.75 min.), contained coating weights of 71.5 (Plate B1) and 43.4 mg/dm$^2$ (Plate B2) respectively. The plates were exposed in air through the usual stepwedge process transparency to a 1000 watt tungsten-halogen lamp at a distance of 24.5 inches (62.4 cm), and the exposed plates were developed for 30 seconds with the development solution of Example 1. The results, summarized in Table I, show that the composition containing Epocryl ® 303.1 is about two steps faster than composition B.

TABLE 1

| Plate | Exposure Time, (min) | Number of Polymer Steps |
| --- | --- | --- |
| A 1 | 0.17 | 1 |
|  | 0.50 | 5 |
|  | 1.0 | 6 |
| A 2 | 0.17 | 2 |
|  | 0.50 | 5 |
|  | 1.0 | 6 |
| B 1 | 0.17 | 0 |
|  | 0.50 | 3 |
|  | 1.0 | 4.5 |
| B 2 | 0.17 | 0 |
|  | 0.50 | 2.5 |
|  | 1.0 | 4.5 |

EXAMPLE 6

This example compares the relative effectiveness of the free-radical generation system of the invention with a control system. A solution of 2.5 g of 9:1 copolymer of methyl methacrylate and methacrylic acid in 5 g of 2-butanone was prepared, and to this solution was added 2.5 g of Epocryl ® 12, 0.2 g of 2-o-chlorophenyl-4,5-diphenylimidazolyl dimer, 0.15 g of Michler's ketone, 0.01 g of Leuco Crystal Violet, 0.05 g of C.I. Solvent Red Dye #109, and enough 2-ethoxyethanol to give a total of 25 g of solution (Solution A). A second solution was prepared in which the 2-o-chlorophenyl-4,5-diphenylimidazolyl dimer of Solution A was replaced with a like amount of benzophenone (Solution B). The solutions were spin-coated onto anodized aluminum substrates (1000 rpm for 0.75 min.) to give coating weights of 37.9 mg/dm$^2$ (Solution A) and 35.9 mg/dm$^2$ (Solution B). The plates were exposed in air through the usual stepwedge process transparency to a 1000 watt tungsten-halogen lamp at a distance of 24.5 inches (62.4 cm), and the exposed plates were developed for 30 seconds with the development solution of Example 1. The results, summarized in Table II, show that the 2-o-chlorophenyl-4,5-diphenylimidazolyl dimer/Michler's ketone initiator system had a photospeed about ten times that of the benzophenone/Michler's ketone system.

TABLE II

| Plate | Exposure Time, (min) | Number of Polymer Steps |
| --- | --- | --- |
| A | 0.17 | 1 |
|  | 0.50 | 2 |
|  | 1.0 | 3 |
| B (Control) | 0.17 | no image |
|  | 0.50 | no image |
|  | 1.0 | <1 |
|  | 1.25 | <1 |
|  | 2.0 | ~1 |
|  | 2.5 | 1 |
|  | 5.0 | 2 |

EXAMPLE 7

A solution of 15.0 g of a 9:1 copolymer of methyl methacrylate and methacrylic acid in 50 g of 2-butanone was prepared, and to it was added 15.0 g of Epocryl ® 12, 1.2 g of 2-o-chlorophenyl-4,5-diphenylimidazolyl dimer, 0.9 g of Michler's ketone, 0.06 g of Leuco Crystal Violet, 0.30 g of C.I. Solvent Red Dye #109, 16.7 g of methyl chloroform and 150 g of 2-ethoxyethanol. The resulting 13% solids solution was coated onto oriented polyester film substrates using a 0.5 mil (0.00127 cm) doctor knife and dried.

The plates were exposed for various periods of time under 27 inches of vacuum through a high contrast half-tone process transparency (150 lines/in) to a 275 watt sun-lamp held 7.5 inches (19.1 cm) away from the plates. After exposure, the plates were developed for 30 seconds with the development solution of Example 1. The developed plates were rinsed with water, dried, and the sizes of the developed dots were measured using a Filar eyepiece at 200 X. The results, summarized in Table III, represent the average of the measurement of ten dots of each size. The target dot sizes were 36.6µ for the 2% dots and 31.4µ for the 98% dots.

TABLE III

| Exposure Time, (min) | Dot Size, (microns) | |
| --- | --- | --- |
|  | 2% dots | 98% dots |
| 0.5 | 33.0 | 37.2 |
| 0.67 | 37.2 | 29.8 |
| 0.83 | 38.8 | 31.2 |
| 1.0 | 38.6 | 31.2 |
| 1.17 | 39.4 | 31.2 |

The results show that the photopolymerizable composition of the invention reproduced the target dot sizes with very high fidelity.

EXAMPLE 8

A solution of a mixture of 15.0 g of a 9:1 copolymer of methyl methacrylate and methacrylic acid, 15.0 g of Epocryl ® 303.1, 1.2 g of 2-o-chlorophenyl-4,5-diphenylimidazolyl dimer, 0.9 g of Michler's ketone and 128.4 g of 2-ethoxyethanol was prepared. To 75 g of this solution was added 2.65 g of Monastral ® Blue GF pigment, 0.56 g of an acidic dispersing agent and 71.5 g of 2-ethoxyethanol. The mixture was mixed in a sand mill for 0.5 hour, and it was passed through a coarse glass filter frit to remove large undissolved particles. The resulting dispersion was used to spin-coat a rough (1–2µ) 15×20 inch (38.1×50.8 cm) aluminum plate substrate (330 rpm) to give a coating weight of 17.5 mg/dm$^2$. The plate was exposed through a process transparency for 2.0 minutes to the Xenon flash lamp used in Example 3 under vacuum (2 mm pressure), and the exposed plate was developed for 30 seconds with the development solution of Example 1 followed by a water rinse. The resulting lithographic plate was evaluated in an accelerated wear test on a Heidelberg Press using abrasive ink and a 3-mil overpack. Little wear was seen until 12,000–15,000 copies had been made. The highlight dots were still retained at the end of the test, but some wear was evident in the high density areas.

EXAMPLE 9

A solution of a mixture of 3.2 g of 2-o-chlorophenyl-4,5-diphenylimidazolyl dimer, 2.4 g of Michler's ketone, 0.8 g of C.I. Solvent Red Dye #109 and 313.6 g of 2-ethoxyethanol was prepared. To 40 g portions of this solution was added X g of Epocryl ® 303.1, (10-X) g of a 9:1 copolymer of methyl methacrylate and methacrylic acid, and 12.0 g of 2-butoxyethanol, and the resulting solution were spin-coated onto anodized aluminum substrates (2000 rpm). The plates were exposed through the usual stepwedge process transparency in a vacuum frame (26 inches of vacuum) for 1.0 minute to a 1000 watt tungsten-halogen lamp at a distance of 70 cm, and the exposed plates were developed for 30 seconds with the development solution of Example 1 followed by a water rinse. The results are summarized in Table IV, and they show the increase in imaging obtained with an increase in quantity of ethylenically unsaturated diester.

TABLE IV

| Epocryl ® 303.1 (X) | Number of Polymer Steps | Initial Coating Weight (mg/dm$^2$) | Coating Weight Retained After Exposure and Development (%)[1] |
|---|---|---|---|
| 2 | —[2] | 15.1 | 69 |
| 3 | 7 | 13.3 | 61 |
| 4 | 8 | 11.3 | 43 |
| 5 | 10 | 11.9 | 21 |
| 6 | 11 | 10.6 | 82 |
| 7 | 11 | 9.8 | 95 |
| 8 | 13 | 8.6 | 95 |

[1]The percent coating weights are an average of two experiments. [2]Because of overall fog no polymer steps were determined.

EXAMPLE 10

This example shows the increase in retained coating weights obtained with mixed binder systems. A solution of a mixture of 15.0 g of a 9:1 copolymer of methyl methacrylate and methacrylic acid, 15.0 g of Epocryl ® DRH-303, 1.20 g of 2-o-chlorophenyl-4,5-diphenylimidazolyl dimer, 0.9 g of Michler's ketone, and 128.4 g of 2-ethoxyethanol was prepared. To 8.00 g portions of this solution was added X g of poly(methyl methacrylate)resin, (0.32-X) g of a 9:1 copolymer of methyl methacrylate and methacrylic acid, and 4.48 g of 2-ethoxyethanol, and the resulting solutions were spin-coated onto anodized aluminum substrates (2000 rpm). The plates were exposed and developed as described in Example 9, and the results are summarized in Table V.

TABLE V

| Polymethyl Methacrylate Resin, (X) | Number of Polymer Steps | Initial Coating Weight (mg/dm$^2$) | Coating Weight Retained After Exposure and Development (%) |
|---|---|---|---|
| 0.00 | 8–9 | — | 34 |
| 0.04 | 11 | — | — |
| 0.08 | 11 | — | — |
| 0.16 | 12–13 | 16.4[1] | 51[1] |
|  |  | 13.7 | 59 |
|  |  | 11.1 | 75 |

[1]These data were obtained on sample plates coated at 1000 rpm.

EXAMPLE 11

A mixture of 15.0 g of a 9:1 copolymer of methyl methacrylate and methacrylic acid, 1.5 g of polymethyl methacrylate resin, 13.5 g of Epocryl ® DRH-303, 1.20 g of 2-o-chlorophenyl-4,5-diphenylimidazolyl dimer, 0.90 g of Michler's ketone, 0.10 g of Leuco Crystal Violet, 0.30 g of C.I. Solvent Red Dye #109, and 210 g of 2-ethoxyethanol was tumbled to effect complete solution. The resulting solution was filtered through a 7$\mu$ filter, and the filtrate was spin-coated (330 rpm) onto a 15×20 inch (38.1×50.8 cm) aluminum plate substrate to give a coating weight of 17.2 mg/dm$^2$. The plate was exposed through a process transparency for 3.0 minutes to the Xenon flash lamp used in Example 3 under vacuum (2 mm pressure), and the exposed plate was developed for 30 seconds with the development solution of Example 1 followed by a water rinse. The resulting lithographic plate was evaluated in an accelerated wear test on a Heidelberg Press using abrasive ink and a 3-mil overpack. No significant wear was seen until 12,000–15,000 copies had been made. At 40,000 copies, most of the 2, 3, 4 and 5% dots were still printing.

EXAMMPLE 12

A mixture of 2.00 g of a 1:1 styrene/maleic anhydride copolymer partially esterified with 2-propanol[1], 4.00 g of Epocryl ® DRH-303, 0.27 g of 2-(o-chlorophenyl)-4,5-di(m-methoxyphenyl)imidazolyl dimer, 0.18 g of Michler's ketone and 0.81 g of poly(methyl methacrylate) injection molding resin was dissolved in 29.04 g of 2-ethoxyethanol and the mixture was rolled until a clear solution was obtained. The solution was spin-coated onto anodized aluminum substrates (2000 rpm) to give a coating weight estimated to be about 20 mg/dm$^2$. The plates were exposed through the usual stepwedge process transparency, after evacuation for 1.0 minute to obtain good registration, to a 1000 watt tungsten-halogen lamp at a distance of 70 cm, and the exposed plates were developed for 30 seconds in a solution prepared from 6.7 g of 37.6% sodium silicate solution, 6.5 ml of 2-butoxyethanol, 20 ml of glycerol and distilled water to make 100 ml of solution, and finally rinsed with water. Plates exposed for 0.27 and 1.1 minutes gave excellent images and showed 8 and 10 polymer steps respectively.

[1]The partially esterified styrene/maleic anhydride co-polymer has an acid number of 270, a softening point of 160°–170° C., and a number average molecular weight of 1700 by vapor pressure osmometry.

EXAMPLE 13

A mixture iof 2.5 g of a 9:1 copolymer of methyl methacrylate and methacrylic acid, 3.50 g of Epocryl ® DRH 303, 0.24 g of 2-(o-chlorophenyl)-4,5-diphenylimidazolyl dimer, and 0.06 g of Michler's ketone was dissolved in 25.20 g of 2-ethoxyethanol (Solution A). Solutions B, C and D were prepared by varying the quantities of Michler's ketone and 2-ethoxyethanol as follows:

Solution B: 0.12 g Michler's ketone; 25.44 g 2-ethoxyethanol
Solution C: 0.18 g of Michler's ketone; 25.68 g 2-ethoxyethanol
Solution D: 0.24 g Michler's ketone; 25.92 g 2-ethoxyethanol The solutions were spin-coated onto anodized aluminum substrates (2000 rpm), to give coating weights estimated to be about 20 mg/dm$^2$, and the plates were exposed in air through the usual stepwedge process transparency to a 1000 watt tungsten-halogen lamp at a distance of 70 cm for 1.0 minute. The exposed plates were developed for 30 seconds with the development solution of Example 1 followed by a water rinse. The results are summarized in Table VI.

TABLE VI

| Solution Plate | 2,4,5-Triarylimidazolyl Dimer/Michler's Ketone Molar Ratio | Number of Polymer Steps |
| --- | --- | --- |
| A | 1.6/1 | 2 |
| B | 0.8/1 | 3 |
| C | 0.5/1 | 4 |
| D | 0.4/1 | 3 |

A mixture of 2.86 g of a 9:1 copolymer of methyl methacrylate and methacrylic acid, 4.00 g of Epocryl® DRH-303, and 0.27 g of 2-(o-chlorophenyl)-4,5-diphenylimidazolyl dimer in 28.60 g of 2-ethoxyethanol was prepared (Solution A). To 8.0 g of solution A were added 0.04 g of 4-morpholinobenzophenone and 1.07 g of 2-ethoxyethanol (Solution B), and to a second 8.0 g portion of Solution A were added 0.04 g of Michler's ketone and 1.07 g of 2-ethoxyethanol (Solution C).

Solutions B and C were spin-coated onto anodized aluminum substrates (1000 rpm), to give coating weights estimated to be about 35 mg/dm$^2$, and the plates were exposed through the usual stepwedge process transparency, after evacuation for 1.0 minute, to a 275 watt sunlamp at a distance of 7.5 inches (19.1 cm) for 1.0 minute. The exposed plates were developed for 30 seconds with the development solution of Example 1 followed by a water rinse. The plate from Solution C was approximately 8×faster (12 polymer steps) than the plate from solution B (6 polymer steps).

EXAMPLE 15

Solution A of Example 14 was prepared, and the following solutions were prepared from it.
Solution B: 8.0 g Solution A; 0.02 g 4-(N,N-dimethylamino)-acetophenone; 0.98 g 2-ethoxyethanol
Solution C: 8.0 g Solution A; 0.01 g 4-(N,N-dimethylamino)-acetophenone; 0.93 g 2-ethoxyethanol
Solution D: 8.0 g Solution A; 0.04 g 4-(N,N-dimethylamino)-acetophenone; 1.07 g 2-ethoxyethanol.

Solutions B, C and D were spin-coated onto anodized aluminum substrates (1000 rpm), to give coating weights estimated to be about 35 mg/dm$^2$, and the plates were exposed through the usual stepwedge process transparency, after evacuation for 1.0 minute, to a 1000 watt tungsten-halogen lamp at a distance of 70 cm for 1.0 minute. The exposed plates were developed for 30 seconds by rubbing gently with a solution prepared from 0.8 g of sodium carbonate, 60 ml of water and 40 ml of 2-(2-butoxyethoxy)ethanol. The results are summarized in Table VII.

TABLE VII

| Solution Plate | 2,4,5-Triarylimidazolyl Dimer/p-aminophenyl ketone Molar Ratio | Number of Polymer Steps |
| --- | --- | --- |
| B | 0.7/1 | 6 |
| C | 1.5/1 | 6 |
| D | 0.4/1 | 7 |

EXAMPLE 16

A mixture of 2.00 g of a bisphenol-A epoxymethacrylate[1], 1.00 g of a 9:1 copolymer of methyl methacrylate and methacrylic acid, 0.12 g of 2-(o-chlorophenyl)-4,5-diphenylimidazolyl dimer, and 0.09 g of Michler's ketone was dissolved in 12.84 g of 2-ethoxyethanol, and the solution was spin-coated onto anodized aluminum substrates (2000 rpm), to give a coating weight estimated to be about 20 mg/dm$^2$. The plates were exposed in air through the usual stepwedge process transparency to a 1000 watt tungsten-halogen lamp at a distance of 70 cm. The exposed plates were developed for 30 seconds with the development solution of Example 1 followed by a water rinse, and the results are summarized in Table VIII.

[1]Reaction product of one molar equivalent of a commercially available (Araldite® 7097; Ciba-Geigy Co.) epoxy resin, n=14, prepared from bisphenol-A and epichlorohydrin, and two molar equivalents of methacrylic acid.

TABLE VIII

| Exposure Time, (min.) | Number of Polymer Steps |
| --- | --- |
| 0.5 | 4 |
| 1.0 | 5 |
| 2.0 | 4 |

EXAMPLE 17

A mixture of 3.6 g of a 9:1 copolymer of methyl methacrylate and methacrylic acid, 8.6 g of an ethylenically unsaturated dimethacrylate polyhydroxy polyether of n=3, 2.19 g of a conventional plasticizer, 0.17 g of 2-(o-chlorophenyl)-4,5-diphenylimidazolyl dimer, 0.17 g of 2-(o-chlorophenyl)-4,5-di(m-methoxyphenyl)imidazolyl dimer, 0.24 g of Michler's ketone, 0.04 g of Leuco Crystal Violet, 0.18 g of tris(4-diethylamino-2-methylphenyl)methane, and 0.24 g of C.I. Solvent Red Dye #109 was dissolved in 125 g of 2-ethoxyethanol and spin-coated onto an anodized aluminum substrate (120 rpm for one minute) to give a coating weight of 14.8 mg/dm$^2$. The plate was exposed through a process transparency for 1.0 minute at 27.8 inches of vacuum to the xenon flash lamp described in Example 3, and then developed for 30 seconds in an aqueous solution containing 4.6% sodium silicate, 4.5% 2-butoxyethanol and 6.9% glycerol. After rinsing in water while gently rubbing with a developer pad, a photopolymer image was obtained which showed six steps of polymer. This lithographic plate was evaluated in an accelerated wear test on a Heidelberg Press using abrasive ink and a 3-mil overpack. No significant wear was seen until 45,000 copies had been made, at which point the dots indicated some sharpening (decrease in size for the highlight dots, increase in size for the shadow holes) but essentially no adhesive loss for the 2, 3, 4 and 5% dots.

EXAMPLE 18

The photocopolymer mixture described in Example 17 was dissolved in 95 g of 2-ethoxyethanol and spin-coated onto an anodized aluminum substrate (120 rpm for one minute) to give a coating weight of 25.2 mg/dm$^2$. The plate was exposed for two minutes at 27.8 inches of vacuum through a process transparency to the xenon flash lamp described in Example 3, and then developed for 30 seconds in the developer solution described in Example 17. After rinsing in water while gently rubbing with a developer pad, a photopolymer image was obtained which showed seven steps of polymer. This lithographic plate was evaluated in an accelerated wear test on a Heidelberg Press using abrasive ink and a 3-mil overpack. 40,000 Impressions were made with no significant signs of wear other than slight dot sharpening.

EXAMPLE 19

A mixture of 3.6 g of a 9:1 copolymer of methyl methacrylate and methacrylic acid, 8.6 g of an ethylenically unsaturated dimethacrylate polyhydroxy polyether in which n=3, R$^4$=H, R$^5$ and R$^6$=CH$_3$ and p=1, 2.3 g of trimethylolpropane triacrylate, 2.7 g of a conventional plasticizer, 0.17 g of 2-(o-chlorophenyl)-4,5-diphenylimidazolyl dimer, 0.17 g of 2-(o-chlorophenyl)-4,5-di(m-methoxyphenyl)imidazolyl dimer, 0.12 g Michler's ketone, 0.04 g of Leuco Crystal Violet, 0.18 g of tris(4-diethylamino-2-methylphenyl)methane, 0.48 g of C.I. Solvent Red Dye #109, and 0.09 g of di(t-butyl)nitrosomethane dimer inhibitor system was dissolved in 125 g of 2-ethoxyethanol, and the solution was spin-coated onto an anodized aluminum substrate (120 rpm for one minute) to give a coating weight of 18 mg/dm$^2$. A sample of the plate was exposed through the usual stepwedge process transparency and a halftone dot target for two minutes at 27.8 inches of vacuum to the xenon flash lamp described in Example 3, and then developed for 1 minute in an aqueous solution containing 4.6% sodium silicate, 4.5% 2-butoxyethanol and 6.9% glycerol. After rinsing in water while gently rubbing with a developer pad, a photopolymer image was obtained which showed four steps of polymer.

EXAMPLE 20

A formulation prepared essentially as described in Example 19 was spin-coated onto an anodized aluminum substrate (120 rpm for one minute) to give a coating weight of 18 mg/dm$^2$. The plate was overcoated with a polyvinyl alcohol solution at a coating weight of 10 mg/dm$^2$. The plate was exposed (1 minute) and developed as described in Example 19 to give a photopolymer image which showed six steps of polymer. This lighographic plate was evaluated in an accelerated wear test on a Heidelberg Press using abrasive ink and a 3-mil overpack. No significant wear was seen until 40,000 copies had been made. At 40,000 copies the 2, 3, 4 and 5% dots were still printing, but some dot sharpening was observed.

What is claimed is:

1. A photopolymerizable element for use as a lithographic printing plate consisting essentially of: a substrate bearing a photopolymerizable layer having a dry weight of 10–70 mg/dm$^2$, said layer consisting essentially of, as photopolymerizable, radiation-sensitive and binder components:

(1) 10–79 percent by weight, based on the total photopolymerizable layer, of ethylenically unsaturated monomer consisting essentially of (a) 75–100 percent by weight of at least one ethylenically unsaturated diester polyhydroxy polyether of the formula

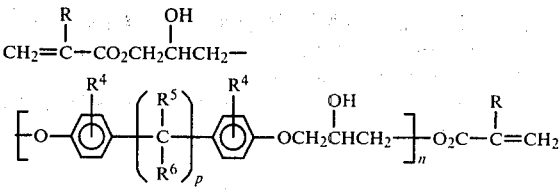

wherein R is H or CH$_3$, R$^4$ is H or an alkyl of 1–4 carbon atoms; n is 1–15; p is 0 or 1; and, when p is 1, R$^5$ is H or CH$_3$, and R$^6$ is H, CH$_3$ or C$_2$H$_5$; and (b) 0–25 percent by weight of conventional ethylenically unsaturated monomer;

(2) 1–10 percent by weight, based on the total photopolymerizable layer, of an organic, radiation-sensitive, free-radical generating system comprising at least one 2,4,5-triarylimidazolyl dimer and at least one p-aminophenyl ketone; and (3) 20–80 percent by weight, based on the total photopolymerizable layer, of a macromolecular, organic, polymeric binder.

2. The photopolymerizable element of claim 1 wherein R$^4$ is hydrogen, p is 1, and R$^5$ and R$^6$ are methyl.

3. The photopolymerizable element of claim 2 wherein n is 1–4.

4. The photopolymerizable element of claim 3 wherein the p-aminophenyl ketone has the formula

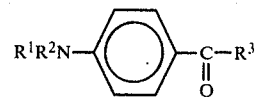

wherein
R$^1$ and R$^2$ are each hydrogen, alkyl of 1–4 carbon atoms, or, together with the shown nitrogen, form a morpholino ring, and
R$^3$ is alkyl of 1–4 carbon atoms, monocarbocyclic aryl or

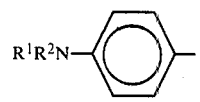

where R$^1$ and R$^2$ are as above.

5. The photopolymerizable element of claim 1 wherein the ethylenically unsaturated diester polyhydroxy polyether is 15–75 percent by weight of the total layer.

6. The photopolymerizable element of claim 5 wherein R$^4$ is hydrogen and R$^5$ and R$^6$ are methyl.

7. The photopolymerizable element of claim 6 wherein n is 1–4.

8. The photopolymerizable element of claim 7 wherein the p-aminophenyl ketone has the formula

wherein
R¹ and R² are each hydrogen, alkyl of 1-4 carbon atoms, or, together with the shown nitrogen, form a morpholino ring, and
R³ is alkyl of 1-4 carbon atoms, monocarbocyclic aryl or

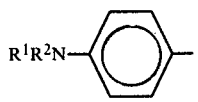

where R¹ and R² are as above.

9. The photopolymerizable element of claim 8 wherein the molar ratio of 2,4,5-triarylimidazolyl dimer to p-aminophenyl ketone is in the range of 0.3-1.5:1.

10. The photopolymerizable element of claim 9 wherein up to 25 percent by weight of the ethylenically unsaturated diester polyhydroxy polyether is replaced with at least one conventional ethylenically unsaturated compound.

11. The photopolymerizable element of claim 9 wherein the molar ratio of 2,4,5-triarylimidazolyl dimer to p-aminophenyl ketone is in the range of 0.5-1:1.

12. The photopolymerizable element of claim 11 wherein the p-aminophenyl ketone is Michler's ketone and the 2,4,5-triarylimidazolyl dimer is 2-(o-chlorophenyl)-4,5-diphenylimidazolyl dimer.

13. The photopolymerizable element of claim 11 wherein the ethylenically unsaturated diester polyhydroxy polyether is 45-75 percent by weight of the total layer and the polymeric binder is 20-50 percent by weight of the total layer.

14. The photopolymerizable element for use as a lithographic printing plate consisting essentially of: a substrate bearing a photopolymerizable layer having a dry weight of 10-70 mg/dm², said layer comprising:

(1) 45-75 percent by weight, based on the total photopolymerizable layer, of at least one ethylenically unsaturated diester polyhydroxy polyether of the formula

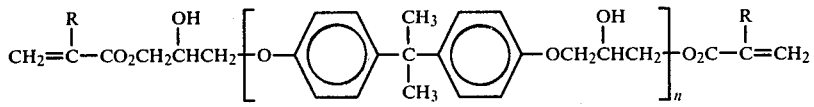

wherein R is H or $CH_3$ and n is 1-4;

(2) 1-10 percent by weight based on the total photopolymerizable layer, of a polymerization initiating system consisting essentially of a mixture of 2-(o-chlorophenyl)-4,5-diphenylimidazolyl dimer and Michler's ketone at a molar ratio in the range of 0.5-1:1; and (3) 20-50 percent by weight, based on the total photopolymerizable layer, of a macromolecular, organic, polymeric binder.

15. The photopolymerizable element of claim 14 wherein the substrate is an aluminum sheet and the polymeric binder contains pendant carboxylic acid or sulfonic acid groups.

* * * * *